(12) United States Patent
Fleischer et al.

(10) Patent No.: US 11,973,073 B2
(45) Date of Patent: Apr. 30, 2024

(54) PHOTOVOLTAIC DEVICE

(71) Applicant: Siemens Energy Global GmbH & Co. KG, Munich (DE)

(72) Inventors: Maximilian Fleischer, Höhenkirchen (DE); Armin Schnettler, Munich (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 17 days.

(21) Appl. No.: 17/813,481

(22) Filed: Jul. 19, 2022

(65) Prior Publication Data
US 2022/0352136 A1 Nov. 3, 2022

Related U.S. Application Data

(63) Continuation of application No. 16/492,108, filed as application No. PCT/EP2018/055499 on Mar. 6, 2018, now abandoned.

(30) Foreign Application Priority Data

Mar. 8, 2017 (DE) .......................... 102017203809.8
Mar. 31, 2017 (DE) .......................... 102017205524.3

(51) Int. Cl.
*H01L 25/16* (2023.01)
*G05F 1/67* (2006.01)
(Continued)

(52) U.S. Cl.
CPC .............. *H01L 25/167* (2013.01); *G05F 1/67* (2013.01); *H01L 31/02021* (2013.01);
(Continued)

(58) Field of Classification Search
CPC ............ H01L 31/02021; H01L 31/043; H01L 25/167; H01L 27/302; G05F 1/67; H10K 30/57; H02S 50/00
See application file for complete search history.

(56) References Cited

U.S. PATENT DOCUMENTS

| 2003/0234038 A1* | 12/2003 | Kurokami | H01L 31/0687 |
| | | | 136/255 |
| 2010/0052425 A1* | 3/2010 | Moore | H02J 13/00006 |
| | | | 307/52 |
| 2012/0068547 A1* | 3/2012 | Vermeersch | G05F 1/67 |
| | | | 307/82 |

FOREIGN PATENT DOCUMENTS

JP 2004259762 A * 9/2004

OTHER PUBLICATIONS

Machine translation of JP-2004259762-A, Handa K. (Year: 2004).*

* cited by examiner

*Primary Examiner* — Mayla Gonzalez Ramos (57) ABSTRACT

A photovoltaic device includes a first group of photovoltaic cells of a first cell type, the first group of photovoltaic cells operable to produce a first current and a first voltage, and a second group of photovoltaic cells of a second cell type that is different than the first cell type, the second group of photovoltaic cells operable to produce a second current and a second voltage. A first power electronics unit is connected to the first group of photovoltaic cells, and a second power electronics unit is connected to the second group of photovoltaic cells. The second power electronics unit is separate from and not communicating with the first power electronics unit. A control device is operable to vary a first property of the first power electronics unit to vary the first current and the first voltage and to vary a second property of the second power electronics unit to vary the second voltage and the second current independent of the first voltage and the first current.

20 Claims, 3 Drawing Sheets

(51) Int. Cl.
*H01L 31/02* (2006.01)
*H01L 31/043* (2014.01)
*H02S 50/00* (2014.01)
*H10K 30/57* (2023.01)

(52) U.S. Cl.
CPC ............ *H01L 31/043* (2014.12); *H02S 50/00* (2013.01); *H10K 30/57* (2023.02)

PHOTOVOLTAIC DEVICE

CROSS-REFERENCE TO RELATED APPLICATIONS

This application is a continuation of U.S. Ser. No. 16/492,108 filed Jan. 10, 2020, which is a National Stage of International Application No. PCT/EP2018/055499, filed Mar. 6, 2018, which claims the benefit of German Patent Application No. 10 2017 203 809.8, filed Mar. 8, 2017, and German Patent Application No. 10 2017 205 524.3, filed Mar. 31, 2017. The entire contents of these documents are hereby incorporated herein by reference.

BACKGROUND

The present embodiments relate to a photovoltaic device having two or more separate solar cells.

Solar power generation using photovoltaic (PV) devices is contributing, for environmental and increasingly also economic reasons (e.g., in Central Europe), to electricity production to a rapidly increasing extent. However, this regenerative energy source, also and in particular in comparison with conventional energy sources, has to be competitive. For this reason, it is sought to drive PV power generation costs below those of conventional (e.g., fossil energy generation) even in regions with moderately intensive solar irradiation (e.g., Germany).

The costs of a PV facility are determined for the most part by system costs (e.g., for the overall panel, the wiring, the power electronics, and other structural costs). Even though what are known as perovskite materials such as, for example, $CH_3NH_3PbI_3$ (or more generally $(CH_3NH_3)MX_{3-x}Y_x$ (where M=Pb or Sn and X, Y=I, Br or Cl)), which permit a high-efficiency conversion of electromagnetic radiation energy into electrical energy due to their optoelectronic properties, have gained in significance in recent years and promise an effect that lowers operating costs, using such new, inexpensive solar cells on their own is not yet sufficient. By contrast, the efficiency of the solar cells is to be further increased.

One approach for increasing efficiency is that of using tandem PV cell groups in which two or even more light-sensitive PV cells or layers are arranged above one another. The various cells in this case differ ideally in terms of spectral sensitivity (e.g., different cells have respective maximum efficiency for different spectral ranges of sunlight). This has the effect that the tandem cell group as a whole offers high efficiency for a broader spectral range.

Such a tandem cell group may have, for example, a conventional silicon-based PV cell to which a further PV cell (e.g., perovskite-based) is applied. Perovskite materials have a greater bandgap than silicon-based materials. Due to this, the perovskite-based PV cell has a higher absorption component in the blue or short-wave spectral range and lets through light of a longer wavelength. The silicon-based PV cell absorbs to a greater extent in the longer-wavelength spectral range, such that the light let through by the perovskite cell or layer or at least part thereof is absorbed by the silicon cell.

Figure 1:
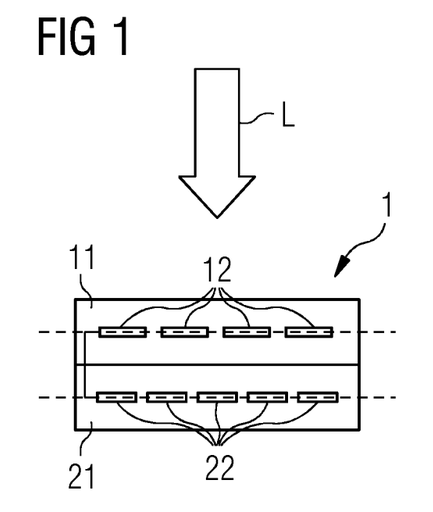
FIG. 1 shows a tandem PV cell group according to the prior art.

FIG. 1 shows a side view of such a known tandem PV cell group 1. The upper cell 11 (e.g., facing the light source or the sun, not illustrated) of the tandem cell group 1 is a PV cell made from a first material having maximum efficiency in a first spectral range S1. The lower cell 21 is a PV cell made from a second material having maximum efficiency in a second spectral range S2. The spectral ranges S1, S2 and also the materials are different. Such tandem cell groups operate in principle in accordance with the concept that the electric current I generated under light incidence L flows successively through both cells 11, 21 (e.g., the cells 11, 21 are electrically connected in series). In this case, however, the problem occurs that in the event that currents of a significantly different value are generated in the two cells 11, 21, that cell 11, 21 in which a low current is generated is flowed through by the large current of the other cell 21, 11, which may lead to damage. Both cells 11, 21 ideally deliver the same current per light-sensitive surface area. Due to the differing nature of the materials used in the various cells 11, 21, this is, however, generally not the case. This has the effect that the efficiency of the tandem PV cell group 1 is considerably lower on the whole than theoretically possible or would be expected based on the individual efficiencies.

Figure 2:
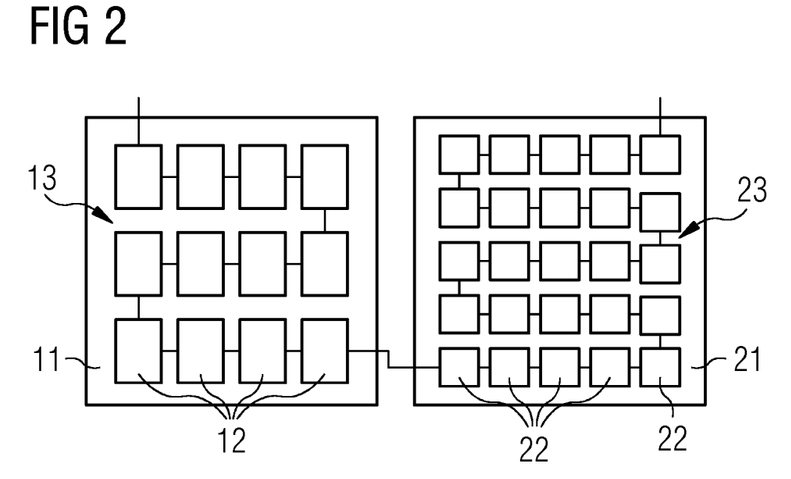
FIG. 2 shows cross sections of the tandem PV cell group according to the prior art.

This problem is able in principle to be solved using an approach known as "current matching," in that the individual cells 11, 21 are configured to deliver electric currents of the same value. To achieve this, the light-sensitive areas 12, 22, which generate the current under appropriate illumination, of the two PV cells 11, 21 may be matched to one another. The areas 12 in the first cell 11 consist of the first material, and the areas 22 in the second cell 21 consist of the second material. It is assumed in this case that the electric current produced in one area 12, 22 is proportional to the surface area of the respective area 12, 22. The surface areas as well as the numbers of areas 12, 22, as indicated in FIG. 2, may accordingly be selected so as to be different, such that the two cells 11, 21 ultimately deliver electric currents of the same value. The variables and numbers to be selected for this purpose for the surface areas in this case depend on the respective materials. The differently formed structures lying above one another in this connection, however, turn out to be technologically problematic.

FIG. 2 shows a view in the y-direction onto the planes indicated by the dashed lines in FIG. 1, where the illustration in FIG. 2 is selected as though the cell 1 of FIG. 1 were to be unfolded such that the two layers 11, 21 now lie next to one another. It is explained that the surface areas of the areas 12 of the first cell 11 are greater than the surface areas of the areas 22 of the second cell 21. In this case, for the sake of clarity, only a few of the respective areas 12, 22 are provided with reference signs. For each PV cell 11, 21, it is the case that the areas 12, 22 of the respective cell 11, 21 are connected in series to form a respective area group 13, 23. The two area groups 13, 23 are also connected electrically in a row (e.g., in series).

Although the concept of matching the surface areas of the light-sensitive areas 12, 22 does theoretically provide a solution to the problem, it turns out in practice that the efficiency of the tandem PV cell group 1 constructed in this way continues to remain on average below the theoretically possible value. This is linked to the fact that the light intensities are in practice not constant over time, but rather are subject to more or less strong deviations throughout the day. This has an effect of differing magnitude on the voltages or currents generated by the various cells. Silicon-based PV cells (Si cells) thus operate at particularly high efficiency at high light intensities (e.g., at full sunlight). The efficiency of such Si cells however drops below the efficiency of, for example, organic PV cells under weaker light. These organic PV cells have comparatively good efficiencies, for example, under diffuse and weak light. It is to be assumed that the different cells are subject to different aging effects and temperature responses. The approach illustrated in FIG. 2 having matched surface areas of the light-sensitive areas is thus ultimately not expedient.

SUMMARY

The scope of the present invention is defined solely by the appended claims and is not affected to any degree by the statements within this summary.

The present embodiments may obviate one or more of the drawbacks or limitations in the related art. For example, an alternative approach for a high-efficiency photovoltaic cell is provided.

In one aspect, a photovoltaic device includes a first group of photovoltaic cells of a first cell type, the first group of photovoltaic cells operable to produce a first current and a first voltage, and a second group of photovoltaic cells of a second cell type that is different than the first cell type, the second group of photovoltaic cells operable to produce a second current and a second voltage. A first power electronics unit is connected to the first group of photovoltaic cells, and a second power electronics unit is connected to the second group of photovoltaic cells. The second power electronics unit is separate from and not communicating with the first power electronics unit. A control device is operable to vary a first property of the first power electronics unit to vary the first current and the first voltage and to vary a second property of the second power electronics unit to vary the second voltage and the second current independent of the first voltage and the first current.

A PV device according to an embodiment has a multi-PV cell group having at least one first PV cell of a first cell type and one second PV cell of a second cell type, where the first cell type and the second cell type differ from one another. Each of the PV cells provides an electric cell voltage U1, U2 under light incidence on the respective PV cell. Also provided are power electronics having a separate first power electronics unit that is assigned to the first PV cell and a separate second power electronics unit that is assigned to the second PV cell. The electric cell voltage U1, U2 generated in the respective PV cell and a corresponding current yield I1, I2 are able to be fed to the separate power electronics unit assigned to the respective PV cell (e.g., via appropriate electrical connections). The PV device also has a control device for controlling the power electronics. The first power electronics unit and the second power electronics unit are then able to be operated independently of one another via the control device such that each PV subsystem, each of which has one of the PV cells and the power electronics unit assigned to the respective PV cell, operates at a respective optimum operating point. In other words, the PV device has at least one first PV subsystem and one second PV subsystem, where the first PV subsystem has the first PV cell and the first power electronics unit, and the second PV subsystem has the second PV cell and the second power electronics unit.

For the design of the high-efficiency multi-PV cell group provided here that does not lose its high efficiency even under variable lighting intensity, it is possible to dispense with the "current matching" approach described above. The tandem PV cell group has two galvanically isolated PV cells that are not directly electrically connected in series or in any other way. Rather, the electric voltages generated by the PV cells of the cell group under illumination and as a result also the corresponding currents are each fed to a separate power electronics unit. By using individual power electronics units for the various PV cells, a situation is achieved whereby each PV cell is able to be operated at the optimum operating point.

The control device is configured, during the operation of the power electronics unit of each PV subsystem, to control the respective power electronics unit such that a product of the current yield I1, I2 and the cell voltage U1, U2 of the PV cell assigned to the respective power electronics unit is at a maximum. It is assumed here and hereinafter that the expression that the product should be "at a maximum" does not necessarily mean or may not necessarily mean at all times the exact point at which the product reaches the absolute maximum. This is also not technically able to be implemented insofar as the values fed to the control device continuously vary in practice within a certain range, such that a theoretically actual maximum value at a time T1 is already no longer the theoretically maximum value at the next time T2. The expression that the respective product should be "at a maximum" accordingly provides that, in the context of the control, control is performed in each case such that the power electronics units are each constantly adjusted such that the respective current-voltage product changes with respect to the instantaneous theoretically possible maximum. Control is thus performed such that the current-voltage product, considered over a particular time period, does not become smaller. In other words, the product may become greater or may remain constant in the event that the theoretically possible maximum has already been reached.

The control device may for this purpose operate such that, during the controlling of the respective power electronics unit, an input resistance of the respective power electronics unit is able to be adjusted such that the product of the current yield I1, I2 and the cell voltage U1, U2 of the PV cell assigned to the respective power electronics unit is at a maximum. The control device is, for example, configured to control the power electronics units independently of one another. The control device may have, for example, a number of controllers corresponding to the number of PV subsystems. These controllers may be configured, for example, as PID controllers.

As an alternative or in addition, the PV device has a sensor device having a device (e.g., a sensor) for determining temperatures of the PV cells and/or for determining an ambient temperature of the multi-PV cell group. One or more parameters describing the temperatures and/or the ambient temperature are fed to the control device as an input variable (e.g., a first input variable and/or a second input variable). In addition, or as an alternative, the sensor device may have a device (e.g., a sensor) for determining a light intensity incident on the PV device (e.g., on the first PV cell). A parameter describing the light intensity is fed to the control device as an input variable (e.g., a third input variable). Likewise, in addition or as an alternative, the sensor device may have a device for determining a spectrum of a light incident on the PV device (e.g., on the first PV cell). A parameter describing the spectrum is fed to the control device as an input variable (e.g., a fourth input variable). The control device is then designed to control the power electronics units based on the first input variable, the second input variable, the third input variable, the fourth input variable, or any combination thereof fed thereto.

The control device is, for example, configured in this case to perform the control (e.g., based on lookup tables or in a model-based manner), such that, depending on the input variable or input variables for each power electronics unit, input resistance is determined and set such that the product of the current yield I and the cell voltage U of the PV cell assigned to the respective power electronics unit is at a maximum.

The first cell type and the second cell type may be selected such that power conversation efficiency (PCE) maximas lie in different spectral ranges, respectively.

For the second PV cell, a cell type is, for example, having a PCE maximum that lies in a spectral range to which the first PV cell is substantially transparent is selected. "Substantially transparent" may be that the first PV cell absorbs this specific spectral range to a much smaller extent in comparison with other spectral ranges. The first PV cell in principle has a specific degree of absorption in each spectral range relevant for this application. It may likewise be assumed that the degree of absorption in some ranges of the light spectrum is comparatively low and thus "substantially transparent."

By way of example, the first PV cell may be a perovskite-based PV cell, and/or the second PV cell may be a silicon-based PV cell.

In this case, the control device is designed to control the power electronics unit assigned to the first perovskite-based PV cell such that hysteresis of output variables of the first PV cell is compensated. This compensation is achieved by correspondingly adjusting the operating parameters of the controller (e.g., PID parameters).

The control device is also configured to execute the control of the power electronics units such that aging of a respective PV cell and/or soiling of the multi-PV cell group or of the individual PV cells is compensated. In this case, it is again sought to optimize the product of the current yield I and the cell voltage U of the PV cell assigned to the respective power electronics unit, where the input resistances of the power electronics units are also set independently of one another here.

In a method according to one or more of the present embodiments for operating such a PV device having a multi-PV cell group, power electronics, and a control device of the types mentioned at the outset, the first and the second power electronics unit are operated independently of one another by the control device, such that each PV subsystem, each of which has one of the PV cells and the power electronics unit assigned thereto, operates at a respective optimum operating point.

During the operation of the power electronics unit of each PV subsystem, the respective power electronics unit is controlled such that a product of the current yield I1, I2 and the cell voltage U1, U2 of the PV cell assigned to the respective power electronics unit is at a maximum.

During the control of the respective power electronics unit, an input resistance of the respective power electronics unit is adjusted such that the product of the current yield I1, I2 and the cell voltage U1, U2 of the PV cell assigned to the respective power electronics unit is at a maximum.

The control device may control the power electronics units independently of one another.

Again, in the event that the PV device has a sensor device of the abovementioned type, the power electronics units are controlled based on the input variable or input variables fed to the control device.

In this case, the control is executed (e.g., based on lookup tables or in a model-based manner), such that, depending on the input variable or input variables for each power electronics unit, input resistance is determined and set with which the product of the current yield I and the cell voltage U of the PV cell assigned to the respective power electronics unit is at a maximum. In this case, an aging curve of a cell situation may also be stored in the lookup table.

For each of the power electronics, the voltage and current levels are thus adjusted such that a maximum energy yield of the respective PV cell is achieved (e.g., each PV cell operates with the power electronics assigned thereto at a respective optimum operating point).

The adjustment may be performed, for example, by controlling the input resistance of the respective power electronics, where controlling the input resistance has an effect on the current yield I in the case of a cell voltage U, dependent on the illumination, of the PV cell connected to these power electronics. The product of the voltage U generated by the PV cell under illumination and the corresponding current I describes the energy yield of the PV cell.

By virtue of the individual adjustment, which is possible via the separate power electronics units, this is able to be performed with considerably lower losses in comparison with the situation with electrically fixedly coupled PV cells, in which one cell type is always operated in a suboptimal manner in practice. The concept is thus based on moving away from previously ubiquitous paradigms of the conventional series connection of individual cells of a multi-PV cell group having common electronics toward the parallelized concept of the individual PV cells, in which separate primary electronics are used to operate both PV cells under optimal conditions and the useful energies are able to be added at the level of the electronics.

By this approach, the explained disadvantages of the various current-carrying capabilities of different PV cells are eliminated. At the same time, each PV cell of the cell group is able to be operated at a corresponding optimum operating point (e.g., by virtue of the fact that separate power electronics are provided for both PV cells, the separate power electronics are both able to be operated continuously at the respective optimum operating point).

The approach that is presented additionally solves another problematic aspect of multi-PV cell groups: PV cells are generally subject to an aging process. In the conventional series connection of the cells of the cell group in accordance with the prior art, this inevitably results in detuning of the matching of the individual cells. This effect no longer plays a role in the approach according to the present embodiments.

In addition, dispensing with "current matching" results in expansive design freedoms for the individual cells. Thus, for example, the surface areas of both PV cells of the cell group may be selected as far as possible freely (e.g., a cell surface area may in each case be used that optimally suits the respective technology). PV cells above one another of the same size may likewise be used. This may be advantageous when using thin-film systems for the individual PV cells, in which layer boundaries and the corresponding stage often constitute technological hurdles for layers deposited thereon.

By virtue of the above-described division of the cell group into individual cells and, for example, the use of separate, independent power electronics, it is possible to use electronics optimized to the respective PV cell. According to one or more of the present embodiments, due to the separate electronics, it is possible, in addition to adjusting to the respective optimum operating point, to address yet further problematic topics that occur specifically in new perovskite-based PV cells. By way of example, a perovskite-based cell exhibits hysteresis of the output characteristic variables of the cell (e.g., the output characteristics of the cell change depending on the previous operation of the cell). This is able to be compensated, for example, by adjusting the PID parameters of a PID controller integrated in the power electronics of the perovskite-based PV cell.

Perovskite-based PV cells, in contrast to conventional PV cells, often exhibit an inflow effect, which involves the maximum efficiency of the cell, often referred to as "power conversion efficiency" (PCE), being achieved, under constant illumination, only after a certain delay time after the cell is put into service. In contrast to the perovskite-based cell, the PCE of a silicon-based PV cell is achieved virtually immediately after putting into service. Again due to the separate power electronics units and the individual control of the different PV subsystems, both subsystems are able to be operated at the optimum operating point. Although the energy yield of the perovskite-based cell is reduced in comparison with the yield of the other cells during the effects of the inflow effect, it is nevertheless optimum for the existing conditions due to the option of individual control.

The concept is able to be applied not only in the case of the combination of perovskite-based and silicon-based cells, but in principle to any desired combinations with other PV cell types, such as, for example, thin-film solar cells or with III/V semiconductor cells.

Further advantages and embodiments become apparent from the drawings and the corresponding description.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

The same reference signs in different figures identify the same components.

Figure 3:
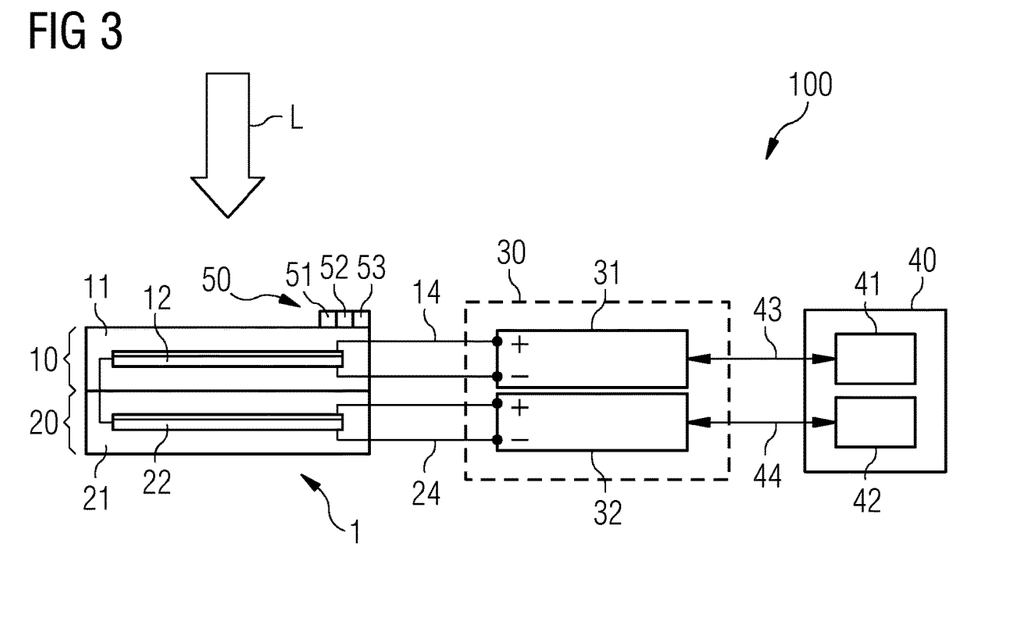
FIG. 3 shows a PV device according to an embodiment.

FIG. 3 shows one embodiment of a photovoltaic (PV) device 100 having a multi-PV cell group 1 that has a first PV cell 11 of a first cell type (e.g., having one or more first light-sensitive areas 12 made from a first material that provide an electric voltage U1 under illumination) and a second PV cell 21 of a second cell type (e.g., having one or more second (not illustrated) light-sensitive areas 22 made from a second material that likewise provide an electric voltage U2 under illumination). The multi-PV cell group 1 having two PV cells 11, 21 is accordingly a tandem PV cell group. For the sake of simplicity, the expression is generally used below that the respective PV cell generates a voltage or the like; this, however, provides that these voltages are generated by the respective light-sensitive areas of the cells.

The cell group 1 is arranged during operation such that the first PV cell 11 faces a light source (e.g., the sun). The light L emitted by the light source and incident on the cell group 1 thus impinges first of all on the first PV cell 11, which, as is known, leads to the first PV cell 11 or light-sensitive areas 12 of the first PV cell 11 made from the first material generating the first electric cell voltage U1. After passing through the first PV cell 11, the corresponding remaining light impinges on the second PV cell 21, which likewise, as is known, leads to the second PV cell 21 or light-sensitive areas 22 of the second PV cell 21 made from the second material generating a second electric cell voltage U2.

Both the first cell type and the second cell type are selected such that the maximum efficiency of the various cells 11, 21, which is also referred to as "power conversion efficiency" (PCE), lie in different spectral ranges. For example, for the second PV cell 21, a cell type having a PCE maximum that lies in a spectral range to which the first PV cell 11 is substantially transparent is selected. "Substantially transparent" may be that the first PV cell 11 absorbs this specific spectral range to a much smaller extent in comparison with other spectral ranges. The first PV cell 11 in principle has a specific degree of absorption in each spectral range relevant for this application; it may likewise be assumed that the degree of absorption in some ranges of the light spectrum is comparatively low, and the cell 11 is thus "substantially transparent" to this spectral range.

In the example that is shown, the first PV cell 11 is a perovskite-based PV cell (e.g., the light-sensitive areas 12 of the first PV cell 11 have a perovskite material). The second PV cell 21 is a silicon-based PV cell. Perovskite materials have a greater bandgap than silicon-based materials. Due to this, the perovskite-based PV cell 11 has a higher absorption component in the blue or short-wave spectral range and lets through light of a longer wavelength. The silicon-based PV cell 21 absorbs to a greater extent in the longer-wavelength spectral range, such that the light let through by the perovskite cell 11 or at least part thereof is able to be absorbed by the silicon cell 21.

The PV device 100 has power electronics 30 having a first power electronics unit 31 and a second power electronics unit 32 (e.g., power electronics units 31, 32), where the power electronics units 31, 32 operate separately and independently of one another. The first power electronics unit 31 is assigned to the first PV cell 11, and the second power electronics unit 32 is assigned to the second PV cell 21. The first PV cell 11 and the first power electronics unit 31 form, for example, a first PV subsystem 10 of the cell group 1. Likewise, the second PV cell 21 and the second power electronics unit 32 form, for example, a second PV subsystem 20 of the cell group 1. The cell voltages U1, U2 generated by the PV cells 11, 21 under illumination are fed to the respective power electronics unit 31, 32 via appropriate electrical connections 14, 24. Corresponding current yields I1, I2 result depending on a respective input resistance of the power electronics units 31, 32.

The PV device 1 also has a control device 40 that is configured, during operation of the power electronics unit 31, 32 of each PV subsystem 10, 20, to control the respective power electronics unit 31, 32 such that a product of the current yield I1 or I2 and the cell voltage U1 or U2 of the PV cell 11, 21 assigned to the respective power electronics unit 31, 32 is at a maximum. This leads to the energy yield of the respective PV subsystem 10, 20 reaching a maximum. The optimum operating point is reached individually and independently of one another for the PV subsystems 10, 20.

Figure 4:
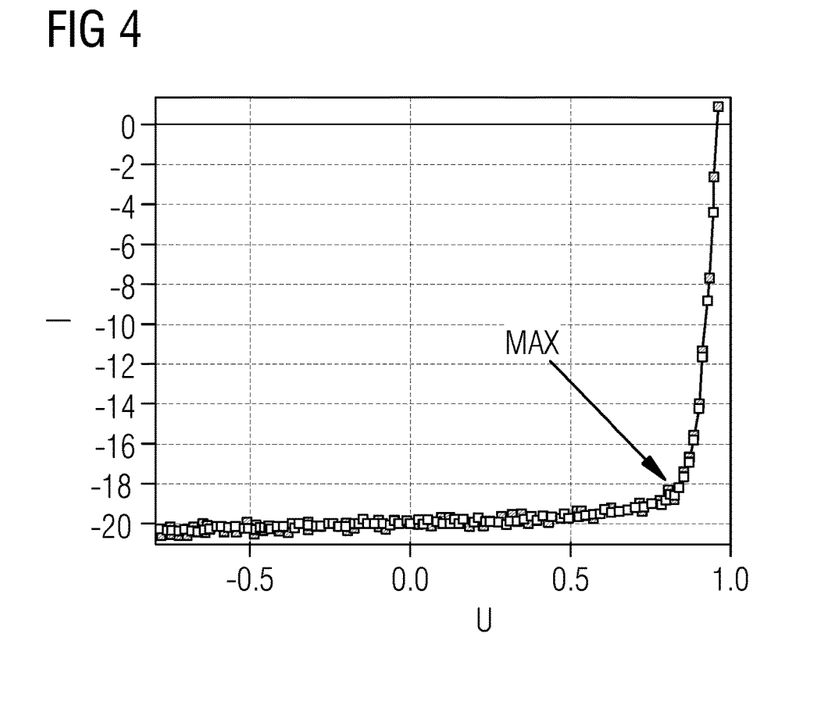
FIG. 4 shows a relationship between current yield I and cell voltage U in the case of a typical PV cell.

In this context and to explain the operation of the control device 40, FIG. 4 shows the relationship between current yield I and cell voltage U under constant illumination for a typical PV cell. The optimum operating point with maximum energy yield or optimum energy generation lies at the point identified by MAX in the graph. At this point, the product of cell voltage U and current yield I reaches a maximum. In variable usage conditions (e.g., under changing lighting conditions), due to the differing nature of the PV cells 11, 21 of the cell group 1, which typically respond differently to changes in light intensity and temperature, etc., situations inevitably arise in which at least one of the PV cells 11, 21 is no longer operated at the optimum operating point. This provides, for the entire cell group 1, that the cell group 1 is not able to be used at the optimum operating point as a whole. It is only possible to operate the cell group 1 at the optimum operating point when the individual PV cells 11, 21 forming the cell group 1 or the PV subsystems 10, 20 are each operated on their own at the optimum operating point. To achieve this, use is made of the separate power electronics 31, 32, since using the separate power electronics 31, 32 individually and independently makes it possible to individually optimize the operating parameters for each PV cell 11, 21 or for each PV subsystem 10, 20.

The control device 40 is then configured, during the controlling of the respective power electronics unit 31, 32, to adjust an input resistance of the respective power electronics unit 31, 32 and thus the current yield I in the respective PV subsystem 10, 20, such that the product of the current yield I1 or I2 and the cell voltage U1 or U2 is at a maximum for the PV cell 11, 21 assigned to the respective power electronics unit 31, 32. The control device 40 controls the power electronics units 31, 32, for example, independently of one another. For this purpose, the control device 40 may have, for example, a number of controllers 41, 42 corresponding to the number of PV subsystems 10, 20, where each power electronics unit 31, 32 or each PV subsystem 10, 20 is assigned a controller 41, 42. These controllers 41, 42 may be configured, for example, as PID controllers.

The control device 40 or the individual controllers 41, 42 operate, for example, such that, for each PV subsystem 10, 20, a current yield I1 or I2 for the respective PV subsystem 10, 20 and the cell voltage U1 or U2 are measured separately. Specifically, for example, the first controller 41 may vary the input resistance of the first power electronics unit 31 based on the values of I1 and U1 that are fed to the first controller, and in the process, monitor the current yield I1 and the cell voltage U1 or the product of these measured values. The input resistance is then set such that, as already mentioned, the product of current yield I1 and cell voltage U1 reaches a maximum, accompanied by maximum energy yield of the first PV subsystem 10. The controller 42 of the second PV subsystem 42 operates in the same way by varying the input resistance of the second power electronics unit 32, such that the product of current yield I2 and cell voltage U2 of the second PV subsystem 20 also reaches a maximum, accompanied by maximum energy yield of the second PV subsystem 20. By way of the electrical connections 43, 44, indicated by double-headed arrows, between power electronics units 31, 32 and controllers 41, 42, the components 31, 41 or 32, 42 that are connected to one another thus interact with one another such that the controllers 41, 42 are provided with current and voltage values I1, I2, U1, U2. The controllers 41, 42 influence the power electronics units 31, 32 based on these values in that the controllers 41, 42 control input resistances of the power electronics units 31, 32.

In addition, or as an alternative to the procedure explained above based on current and voltage measurements, the control device 40 may be fed data from a sensor device 50. The sensor device 50 has a device 51 (e.g., a sensor) for determining temperatures of the PV cells 11, 21 and/or for determining an ambient temperature of the tandem PV cell group 1. One or possibly more parameters describing the temperatures and/or the ambient temperature are fed to the control device 40 and to the separate controllers 41, 42 as input variables (e.g., a first input variable and/or a second input variable). As an alternative or in addition, the sensor device 50 may have a device 52 (e.g., a sensor) for determining a light intensity incident on the multi-PV cell group 1 and, in particular, on the first PV cell 11. A parameter describing the light intensity is fed to the control device 40 or the controllers 41, 42 as an input variable (e.g., a third input variable). The sensor device 50 may also have a device 53 for determining a spectrum of a light incident on the multi-PV cell group 1 and, in particular, on the first PV cell 11. A parameter describing the spectrum is fed to the control device 40 or the controllers 41, 42 as an input variable (e.g., a fourth input variable). The control device 40 is then configured, based on the input variable, or input variables fed thereto, to control the power electronics units 31, 32 such that the product of the current yield I and the cell voltage U of the PV cell 11, 21 assigned to the respective power electronics unit 31, 32 is at a maximum. This may again be performed by correspondingly adjusting the input resistance of the respective power electronics unit 31, 32. The target values to which the input resistances are set in this case may be determined (e.g., in a model-based manner or based on lookup tables), such that, depending on the input variable or input variables (e.g., the first variable, the second variable, the third variable, the fourth variable, or any combination thereof) for each power electronics unit 31, 32, input resistance is determined and set from a corresponding lookup table so that the product of the current yield I and the cell voltage U of the PV cell 11, 21 assigned to the respective power electronics unit 31, 32 is at a maximum.

The control device 40 may also be used to observe and possibly take into consideration an aging process of the cells 11, 21. If the effectiveness of finding the optimum operating point is monitored in both power electronics units 31, 32, a warning about degradation of one of the cells may be output or the aging state may be monitored.

It is generally the case that soiling of solar cells (e.g., in arid desert regions) occurs due to the deposition of dust, often increased even further by aerosols containing salt. In humid and natural regions, soiling occurs due to the buildup of cells (e.g., green cells), and in industrial regions due to the deposition of particles (e.g., soot). Depositions of dust and green cells have a clearly discernible color and thus change the spectral composition of the light that reaches the actual PV cells. In the case of depositions of soot that are seemingly colorless at first glance (e.g., are substantially black), it becomes clear upon further inspection that the soot particles that appear dark also have a spectrally dependent light absorption. In the event of a mechanical change in the surface (e.g., generation of a matte surface due to sand particles), the light is by contrast scattered, and there is not primarily a spectral shift. In the event of the change resulting from soiling in the spectral composition of the light, there is inevitably detuning of the current generation of the two spectrally different PV individual cells 11, 21 of the tandem cell 1. The only option for being able to operate both cells 11, 21 optimally in a stable manner as before despite soiling is to drive both cells separately or to independently individually control both PV subsystems 10, 20 in accordance with the approach described above. In this, the respective power electronics unit 31, 32 for each subsystem 10, 20 is controlled such that the product of the current yield I and the cell voltage U of the PV cell 11, 21 assigned to the respective power electronics unit 31, 32 is at a maximum. In this application as well, in which it is possible to compensate soiling and in the same way any aging of the PV cells 11, 21, the control is based on setting the input resistance of a respective power electronics unit 31, 32 such that the product reaches a maximum.

The approach proposed here is thus suitable for compensating diverse situations or environmental conditions, where the PV subsystems 10, 20 or the power electronics units 31, 32 are controlled independently of one another.

Figure 5:
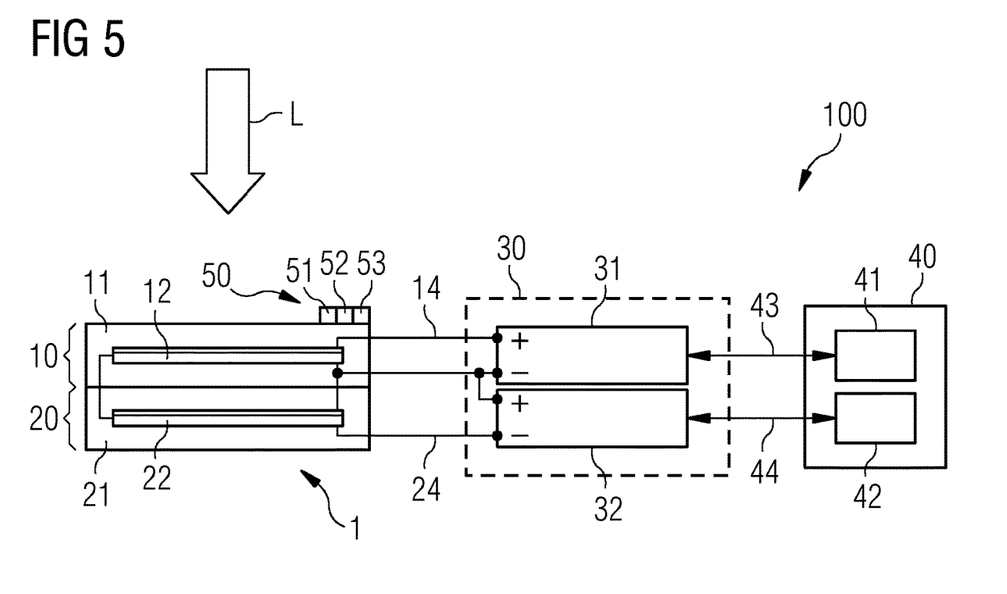
FIG. 5 shows a PV device according to a first variant.

FIG. 5 shows one embodiment of the PV device 100 in which the wiring complexity between the cell group 1 and the power electronics 40 is reduced. For this purpose, the cells 11, 21 are set to a common potential or connected to one another such that only three electrical lines are to be routed to the power electronics 40.

Figure 6:
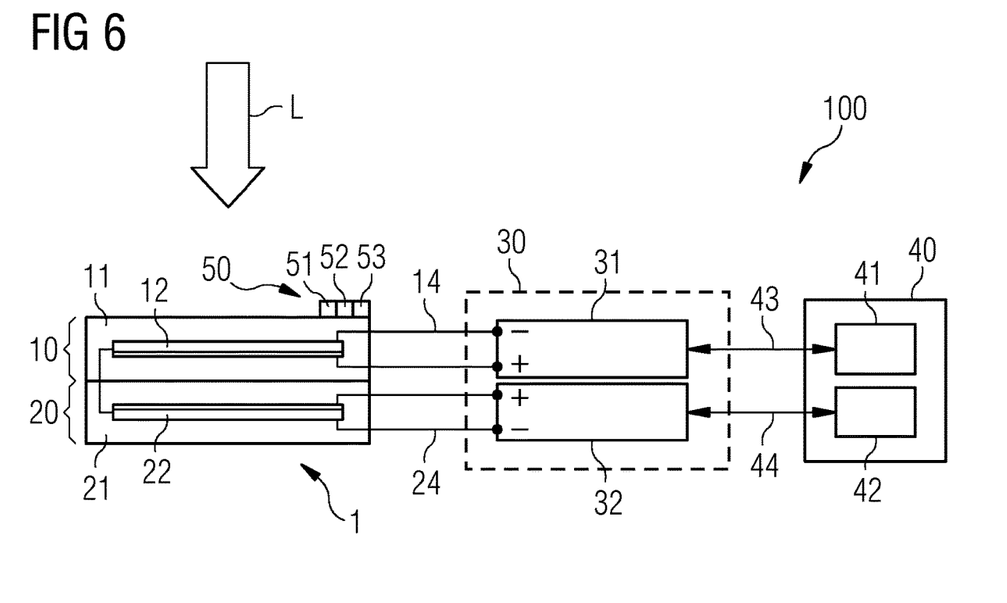
FIG. 6 shows a PV device according to a second variant.

The embodiment shown in FIG. 6 has the effect that the overall occurring voltages of the individual cells 11, 21 and thus the requirements in terms of insulating the wiring are able to be minimized. For this purpose, both cells 11, 21 are arranged such that voltages U1, U2 of the cells 11, 21 oppose one another. This is not expedient in the case of conventional tandem PV cell groups, but may advantageously be applied. It is also optionally expedient, as in the embodiment illustrated in FIG. 5, to place the mutually opposing terminals of the cells 11, 21 at a common potential.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

What is claimed is:

1. A photovoltaic device comprising:
a first group of photovoltaic cells of a first cell type, the first group of photovoltaic cells operable to produce a first current and a first voltage;
a second group of photovoltaic cells of a second cell type that is different than the first cell type, the second group of photovoltaic cells operable to produce a second current and a second voltage;
a first power electronics unit connected to the first group of photovoltaic cells;
a second power electronics unit connected to the second group of photovoltaic cells, the second power electronics unit separate from and not communicating with the first power electronics unit; and
a control device including a first controller operable to vary a first property of the first power electronics unit to vary the first current and the first voltage and a second controller operable to vary a second property of the second power electronics unit to vary the second voltage and the second current independent of the first voltage and the first current and the first controller.

2. The photovoltaic device of claim 1, wherein the first property includes an input resistance of the first power electronics unit and the second property includes an input resistance of the second power electronics unit.

3. The photovoltaic device of claim 1, wherein the first controller varies the first property in response to a measured value for the first current and the first voltage.

4. The photovoltaic device of claim 3, wherein the second controller varies the second property in response to the measured value for the second voltage and the second current.

5. The photovoltaic device of claim 1, further comprising a light intensity device that operates to measure a light intensity incident on one of the first group of photovoltaic cells and the second group of photovoltaic cells, and wherein the control device varies one of the first property and the second property based in part on the measured light intensity.

6. The photovoltaic device of claim 1, further comprising a temperature sensing device that operates to measure a temperature of one of the first group of photovoltaic cells and the second group of photovoltaic cells, and wherein the control device varies one of the first property and the second property based in part on the measured temperature.

7. The photovoltaic device of claim 1, wherein each photovoltaic cell of the first group of photovoltaic cells is perovskite-based and each photovoltaic cell of the second group of photovoltaic cells are silicon-based.

8. The photovoltaic device of claim 1, wherein the first group of photovoltaic cells includes a first plurality of individual cells connected in series and defining a lead cell and a last cell, and the second group of photovoltaic cells includes a second plurality of individual cells connected in series and defining a first cell and a trail cell, the last cell and the first cell directly connected to one another in series.

9. The photovoltaic device of claim 8, wherein the first voltage is the voltage between the lead cell and the last cell and the second voltage is the voltage between the first cell and the trail cell, and wherein the first power electronics unit operates to vary the first voltage and the second power electronics unit operates to control the second voltage independent of one another.

10. A photovoltaic device comprising:
a multi-PV cell group having a first PV cell of a first cell type and a second PV cell of a second cell type, wherein the first cell type and the second cell type differ from one another and wherein the first PV cell provides an electric cell voltage U1 and the second PV cell provides an electric cell voltage U2 under light incidence;
a first power electronics unit that is assigned to the first PV cell;
a second power electronics unit separate from the first power electronics unit and assigned to the second PV cell, wherein the electric cell voltage U1, U2 generated in the respective first PV cell and the second PV cell and a corresponding current yield I1, I2 are fed to the separate first power electronics unit and second power electronics unit assigned to the respective first PV cell and the second PV cell;
a control device for separately controlling the first power electronics unit and the second power electronics unit, the control device including a first controller and an independent second controller;
wherein
the first power electronics unit and the second power electronics unit operate independently of one another by way of the first controller and the second controller such that each of the first PV cell and the second PV cell operates at its optimum operating point.

11. The photovoltaic device according to claim 10, characterized in that the control device is designed, during operation of the power electronics unit of each PV subsystem, to control the first power electronics unit and the second power electronics unit such that a product of the current yield I1, I2 and the cell voltage U1, U2 of the first PV cell and the second PV cell assigned to the respective first power electronics unit and the second power electronics unit is at a maximum.

12. The photovoltaic device according to claim 10, characterized in that the control device is designed, during the controlling of the first power electronics unit and the second power electronics unit, to independently adjust a first input resistance of the first power electronics unit and a second input resistance of the second power electronics unit such that the product of the current yield I1 and the cell voltage U1 of the first PV cell and the product of the current yield I2 and the cell voltage U2 of the second PV cell are at a maximum.

13. The photovoltaic device according to claim 12, further comprising a sensor device, and wherein the sensor device includes one of:
- a device for determining a temperature of one of the first PV cell and the second PV cell, wherein the temperature is fed to the control device as an input variable;
- a device for determining a light intensity incident on one of the first PV cell and the second PV cell, wherein a parameter describing the light intensity is fed to the control device as the input variable;
- a device for determining a spectrum of a light incident on one of the first PV cell and the second PV cell, wherein a parameter describing the spectrum is fed to the control device as the input variable;

wherein
the control device operable to control the first power electronics unit and the second power electronics unit in part on the input variable.

14. The photovoltaic device according to claim 13, wherein the control device includes a lookup table, and wherein the input variable is used with the lookup table to at least partially define the first input resistance and the second input resistance.

15. The photovoltaic device according to claim 10, characterized in that the first cell type and the second cell type are selected such that their PCE maxima lie in different spectral ranges.

16. The photovoltaic device according to claim 10, characterized in that the first PV cell is a perovskite-based PV cell and the second PV cell is a silicon-based PV cell.

17. The photovoltaic device according to claim 16, characterized in that the control device controls the first power electronics unit assigned to the perovskite-based PV cell such that hysteresis of the cell voltage U1 and current yield I1 of the perovskite-based PV cell are compensated.

18. A method for operating a photovoltaic device, the method comprising:

- arranging a multi-PV cell group such that, with respect to an incident light direction, a first PV cell of a first cell type is positioned neared to the source of incident light than a second PV cell of a second cell type;
- directing the incident light onto the first PC cell to generate a first voltage and a first current and subsequently onto the second PV cell to generate a second voltage and a second current;
- providing a measurement of the first voltage, the first current, the second voltage, and the second current to a control device, the control device including a first controller and an independent second controller, the first controller generating a first signal based in part on the measured values of the first voltage and the first current and the second controller generating a second signal based in part on the measured values of the second voltage and the second current;
- varying a first input resistance of a first power electronics unit in response to the first signal to vary the first voltage and the first current;
- varying, independent of the first input resistance, a second input resistance of a second power electronics unit in response to the second signal to vary the second voltage and the second current; and
- operating the first controller to vary the first signal to maximize the product of the first voltage and the first current and operating the second controller to vary the second signal to maximize the product of the second voltage and the second current.

19. The method of claim 18, further comprising sensing a property using a sensor, the sensor including one of:
- a device for determining a temperature of one of the first PV cell and the second PV cell, wherein the temperature is fed to the control device as an input variable;
- a device for determining a light intensity incident on one of the first PV cell and the second PV cell, wherein a parameter describing the light intensity is fed to the control device as the input variable; and
- a device for determining a spectrum of a light incident on one of the first PV cell and the second PV cell, wherein a parameter describing the spectrum is fed to the control device as the input variable;

the method further comprising providing the input variable to the control device, and the control device determining the first signal and the second signal in part based on the input variable.

20. The method of claim 19, further comprising applying the input variable to a lookup table within the control device to generate an output, the control device generating the first signal and the second signal in part based on the output from the lookup table.

* * * * *